United States Patent [19]
Tanzawa

[11] Patent Number: 6,141,277
[45] Date of Patent: Oct. 31, 2000

[54] SEMICONDUCTOR MEMORY PREVENTING SENSE AMPLIFIER MALFUNCTIONS DUE TO EFFECTS OF NOISE GENERATED IN OUTPUT BUFFER

[75] Inventor: Toru Tanzawa, Ebina, Japan

[73] Assignee: Kabushiki Kaisha Toshiba, Kawasaki, Japan

[21] Appl. No.: 09/392,140

[22] Filed: Sep. 9, 1999

[30] Foreign Application Priority Data

Sep. 10, 1998 [JP] Japan .................................. 10-256602

[51] Int. Cl.⁷ ...................................................... G11C 7/02
[52] U.S. Cl. ............... 365/207; 365/189.05; 365/189.04; 365/200
[58] Field of Search ..................................... 365/207, 210, 365/230.06, 185.26, 185.21, 189.05, 200, 189.06

[56] References Cited

U.S. PATENT DOCUMENTS

| | | | |
|---|---|---|---|
| 5,297,093 | 3/1994 | Coffman .................................. | 365/208 |
| 5,321,655 | 6/1994 | Iwahashi et al. ....................... | 365/200 |
| 5,390,147 | 2/1995 | Smaeandoiu et al. .................. | 365/185 |
| 5,898,614 | 4/1999 | Takeuchi .............................. | 365/185.1 |
| 6,018,487 | 1/2000 | Lee et al. ............................... | 365/204 |

OTHER PUBLICATIONS

David Hoff et al.; IEEE Journal of Solid–State Circuits, vol. 24, No. 5; "A23–ns 256K EPROM with Double–Layer Metal and Address Transition Detection"; Oct. 1989; pp. 1250–1257.

Kenichi Imamiya et al.; IEEE Journal of Solid–State Circuits, vol. 25, No. 1; "A 68–ns 4Mbit CMOS EPROM with High–Noise–Immunity Design "; Feb. 1990; pp.72–77.

*Primary Examiner*—David Nelms
*Attorney, Agent, or Firm*—Banner & Witcoff, Ltd.

[57] ABSTRACT

A semiconductor memory includes two memory cores selected, one at a time, to be read from, a data line switch circuit, and a sense amplifier having a pair of input nodes. Each memory core has a memory cell array, a column gate circuit for selectively connecting the bit lines to its associated data line, and a row decoder for selectively driving word lines. At data read time, the data line switch circuit connects the data line of a selected memory core which is to be read from to a predetermined one of the input nodes of the sense amplifier and connects the data line of the non-selected memory core to the other of the input nodes of the sense amplifier. The sense amplifier amplifies the potential difference between its pair of input nodes to thereby sense read data.

29 Claims, 10 Drawing Sheets

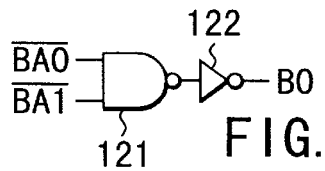
FIG. 19A
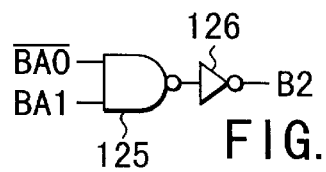
FIG. 19C
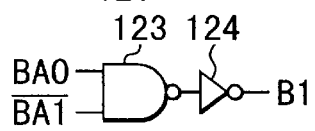
FIG. 19B
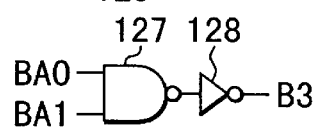
FIG. 19D
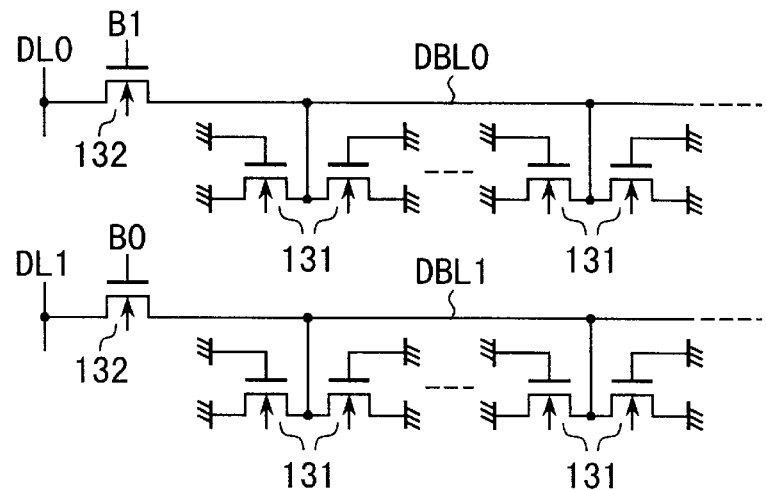
FIG. 20A
FIG. 20B
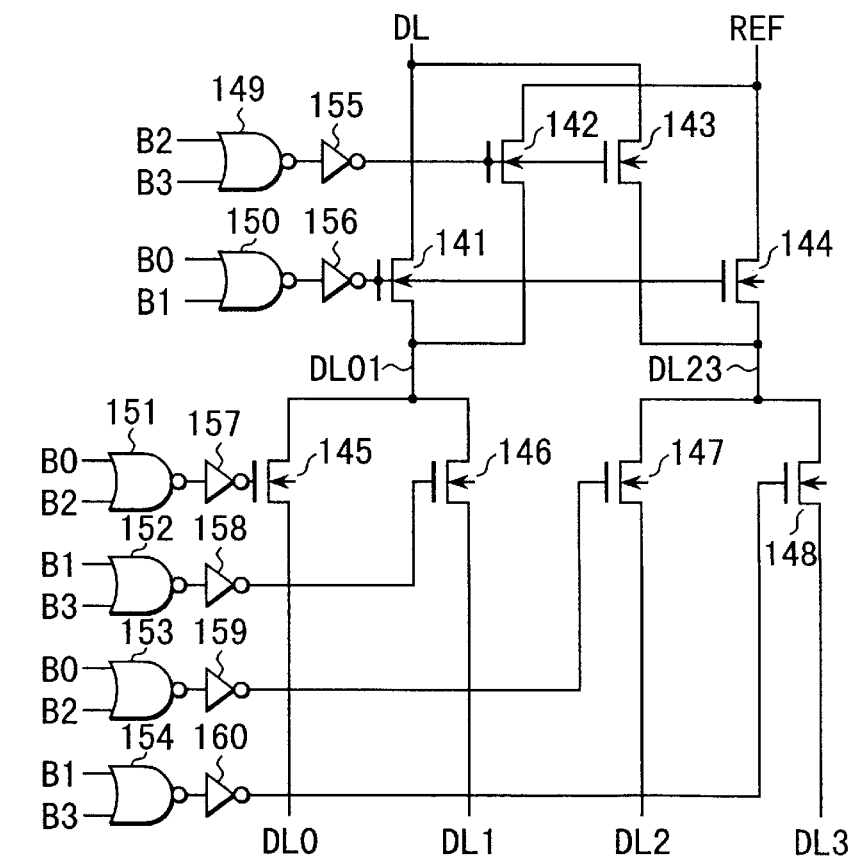
FIG. 21

SEMICONDUCTOR MEMORY PREVENTING SENSE AMPLIFIER MALFUNCTIONS DUE TO EFFECTS OF NOISE GENERATED IN OUTPUT BUFFER

BACKGROUND OF THE INVENTION

The present invention relates to a semiconductor memory, such as a mask ROM provided with a sense amplifier and an output buffer, a flash memory, or the like, and more specifically to a semiconductor memory improved in such a way as to prevent sense amplifier malfunctions due to noise generated in the output buffer.

Among semiconductor memories is a mask ROM. In the mask ROM, each memory cell is formed from a single transistor. Data can be stored by changing the threshold voltage of this transistor.

Data readout is performed by comparing a current that flows in a selected memory cell with a reference current that is set to about half of a current flowing in a memory cell storing a data "1" and amplifying the current difference in the sense amplifier. Data sensed by the sense amplifier is output through the output buffer to outside of the memory.

The operation of the output buffer is controlled by a given control signal. When the control signal is activated during an interval when the sense amplifier is operating, the output buffer may generate noise. In general, the sense amplifier is designed to be high in sensitivity. Upon receipt of the noise, therefore, the sense amplifier outputs temporarily data at opposite level, which disadvantageously lengthens access time.

FIG. 1 shows a general circuit arrangement of a sense amplifier. This sense amplifier is constructed from two pairs of P-channel MOS transistors 161, 162 and 163, 164, each pair forming a current mirror, an N-channel MOS transistor 165 having its drain-source path connected between the drain of the MOS transistor 161 and a sense node (common data line) DL supplied with a potential depending on read data from a memory cell and its gate supplied with a bias voltage BIAS, an N-channel MOS transistor 166 having its drain-source path connected between the drain of the MOS transistor 163 and a reference node (reference node) REF supplied with a reference potential produced by a reference cell RC and its gate supplied with the bias voltage BIAS, and a pair of N-channel MOS transistors 167 and 168 constituting a current mirror. The MOS transistor 167 has its drain-source path connected between the drain of the MOS transistor 164 and ground and the MOS transistor 168 has its drain-source path connected between the drain of the MOS transistor 162 and ground. Sense data SAout is taken at the common drains of the MOS transistors 162 and 168.

Here, the operation of the sense amplifier will be described briefly. When data is read from a memory cell, the sense node DL is supplied with a potential corresponding to that read data, while the reference node is supplied with the reference potential. Note that the reference potential is set to be nearly midway between the potential at the sense node DL when a data "1" is read from the memory cell and the potential at the sense node DL when a data "0" is read.

For example, when a data "0" is read out, the potential at the sense node DL becomes higher than the reference potential, so that current in the P-channel MOS transistor 164 becomes higher than that in the P-channel MOS transistor 162. As a result, sense data SAout at a low (L) level corresponding to ground potential is output. In contrast, when a data "1" is read out, the potential at the sense node DL becomes lower than the reference potential, so that current in the P-channel MOS transistor 162 becomes higher than that in the P-channel MOS transistor 164. As a result, sense data SAout at a high (H) level corresponding to supply voltage Vcc is output.

The N-channel MOS transistor 165 having its gate supplied with bias voltage BIAS is used for a voltage clamping purpose not to allow the supply voltage Vcc to be directly applied to the sense node DL. The bias voltage BIAS is set much lower than the supply voltage Vcc.

The bias voltage BIAS is generated by a bias circuit not shown. The reason why the N-channel MOS transistor 166 having its gate supplied with the bias voltage BIAS is provided on the reference node side is to match characteristics on the reference and sense node sides.

The cause of the elongation of access time in the sense amplifier is variations in bias voltage BIAS resulting from noise generated in the output buffer entering the bias circuit. When the bias voltage BIAS is increased by tens of millivolts, both the sense node DL and the reference node REF are overcharged, but their degrees of overcharging vary according to a difference between load capacitances associated with the respective nodes. For example, when a data "0" is read out, the reference node temporarily becomes higher in potential than the sense node as a result of the reference node being lower in load capacitance than the sense node being overcharged through noise, causing a data "1" (high level) to be output as sense data SAout. As a result, the access time is lengthened.

The load capacitance associated with the sense node is divided into common data line capacitance, column gate capacitance, junction capacitance of the column gate, and bit line capacitance.

Thus, if noise is generated during the sense amplifier operating period and then entered into the sense amplifier, the sense amplifier malfunctions temporarily because the sense node and the reference node in the sense amplifier differ in load capacitance. This causes the elongation of access time.

When an attempt is made to match the load capacitances associated with the sense node and the reference node in order to eliminate such a disadvantage, additional circuitry is required. This results in another disadvantage that the semiconductor chip area has to be increased.

BRIEF SUMMARY OF THE INVENTION

It is therefore an object of the present invention to provide a semiconductor memory which allows the elongation of access time resulting from sense amplifier malfunctions due to noise to be prevented with little increase in integrated-circuit chip area.

According to a first aspect of the present invention, there is provided a semiconductor memory comprising: a plurality of memory cores each having at least one memory cell array composed of a plurality of memory cells, a plurality of word lines connected to the memory cells, a plurality of bit lines connected to the memory cells, a data line, and a column gate circuit for selectively connecting the bit lines to the data line, the memory cores being selected one at a time to read data from a selected memory cell; a sense amplifier having first and second input nodes for amplifying a potential difference between the first and second input nodes to sense data; and a data line switch circuit for connecting the data line associated with a selected one of the memory cores to the first input node of the sense amplifier and connecting the data line associated with a non-selected one of the memory cores to the second input node of the sense amplifier.

According to a second aspect of the present invention, there is provided a semiconductor memory comprising: first and second memory cores each having at least one memory cell array composed of a plurality of memory cells, a plurality of word lines connected to the memory cells, a plurality of bit lines connected to the memory cells, a data line, and a column gate circuit for selectively connecting the bit lines to the data line, the memory cores being selected one at a time to read data from a selected memory cell; a sense amplifier having first and second input nodes for amplifying a potential difference between the first and second input nodes to sense data; a data line switch circuit for connecting the data line associated with a selected one of the memory cores to the first input node of the sense amplifier and connecting the data line associated with the other of the memory cores to the second input node of the sense amplifier; and a reference potential generating circuit connected to the second input of the sense amplifier for generating a reference potential used in the sense amplifier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 19A through 19D show arrangements of partial decoders of the data line decoder of the semiconductor memory of FIG. 16;

FIGS. 20A and 20B show specific arrangements of the dummy cell circuits provided in the memory cores of the semiconductor memory of FIG. 16; and FIG. 21 shows another specific arrangement of the data line switch circuit of the semiconductor memory of FIG. 16.

DETAILED DESCRIPTION OF THE INVENTION

Figure 1:
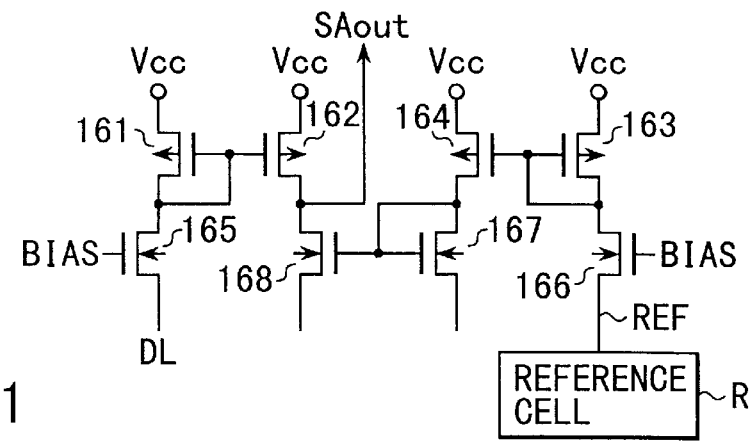
FIG. 1 shows a circuit arrangement of a general sense amplifier.
Figure 2:
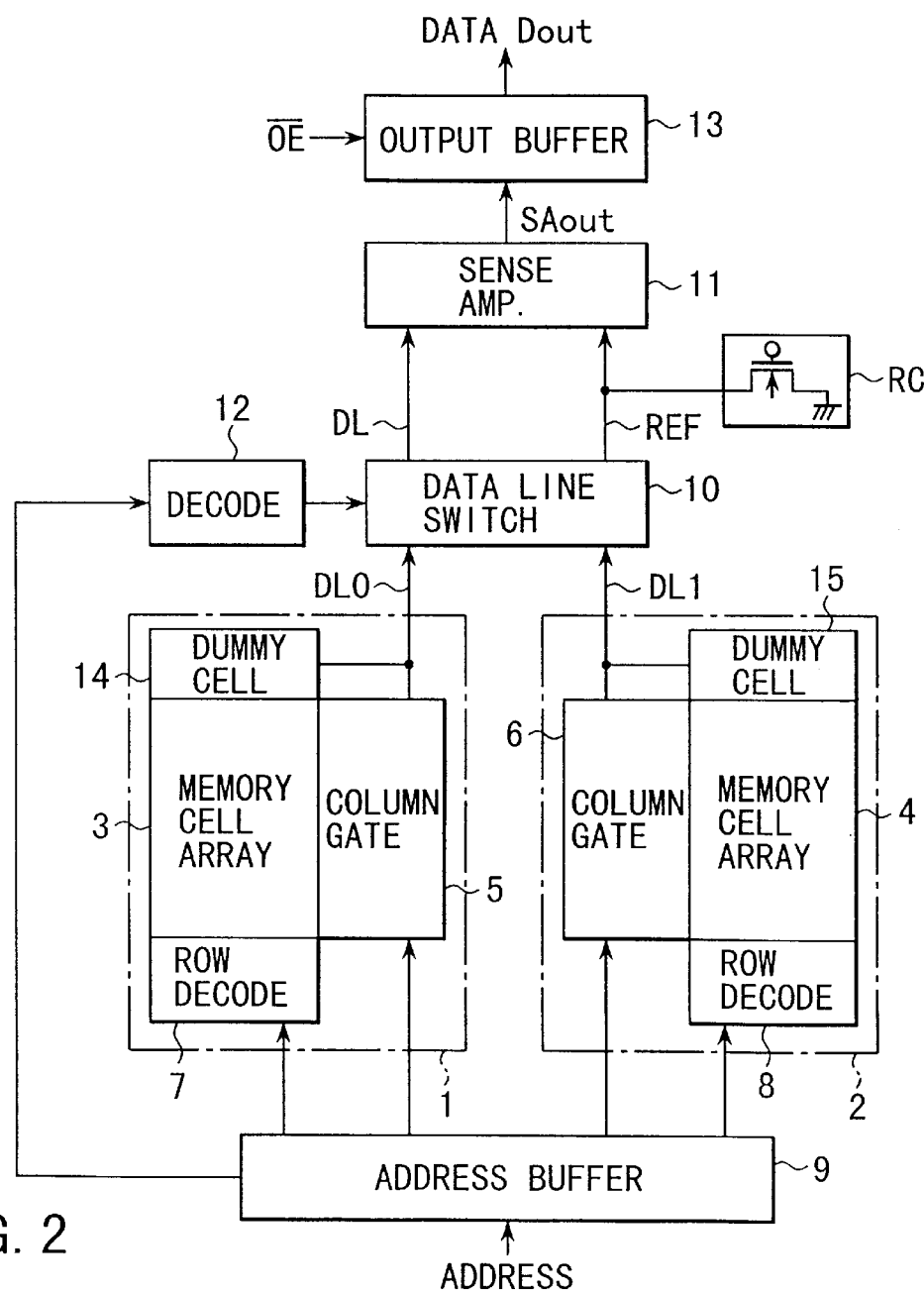
FIG. 2 is a block diagram illustrating the entire configuration of a semiconductor memory according to a first embodiment of the present invention.

Referring now to FIG. 2, there is illustrated, in block diagram form, the entire configuration of a semiconductor memory according to a first embodiment of the present invention. In this figure, 1 and 2 denote memory cores, which have memory cell arrays 3 and 4 in which a plurality of memory cells are arranged in a matrix form. The memory cells are each connected with word and bit lines. The memory cores 1 and 2 are provided with column gate circuits 5 and 6, respectively, each of which makes a selection from the bit lines for connection to a common data line DL0 or DL1, and row decoder circuits 7 and 8 which selectively drive the word lines.

An address buffer 9 is connected to receive an externally applied address signal and generates an internal address signal, which, in turn, is applied to the column gate circuits 5 and 6 and the row decoder circuits 7 and 8 in the memory cores 1 and 2.

One of the common data lines DL0 and DL1 of the respective memory cores 1 and 2 is selected by a data line switch circuit 10 and connected to one of a sense node DL and a reference node REF which are a pair of input nodes of the sense amplifier 11. The operation of the data line switch circuit 10 is controlled by an output of a data line decoder 12 which decodes a portion of an internal address signal generated by the address buffer 9.

To the reference node REF of the sense amplifier 11 is connected a reference potential generating circuit RC which provides a reference potential to the sense amplifier at data read time. The reference potential generating circuit RC uses, as a reference cell, a memory cell of the same type as the memory cells in the memory cell arrays.

The sense amplifier 11 senses read data by amplifying the difference in potential between the sense node DL and the reference node REF and outputs sense data SAout to an output buffer 13.

The output buffer 13 has an output transistor whose size is large enough to drive a large load capacitance associated with its data output terminal. Upon receipt of sense data SAout, the output buffer amplifies it and provides output data Dout in response to an output enable signal /OE.

The memory cores 1 and 2 are provided with dummy cell circuits 14 and 15, respectively, which allow the reference node REF to have load capacitance which is substantially equal to the load capacitance of the sense node DL when data is sensed by the sense amplifier 11. Each dummy cell circuit, when its associated memory core is not selected at data read time, increases load capacitance associated with the corresponding common data line DL0 (or DL1).

In the semiconductor memory thus arranged, for example, when a memory cell in the memory cell array 3 in the memory core 1 is read from, it is selected by the column gate circuit 5 and the row decoder circuit 7, so that the bit line connected to the selected memory cell is connected to the common data line DL0 through the column gate circuit 5. Thus, data read from the selected memory is sent to the common data line DL0 through the bit line and the column gate circuit 5.

At this point, in the non-selected memory core 2, the dummy cell circuit 15 is connected to the common data line DL1.

The data line switch circuit 10 is responsive to the output of the data line decoder 12 to connect the common data line DL0 of the memory core 1 to the sense node DL of the sense amplifier 11 and the common data line DL1 of the memory core 2 to the reference node REF. The common data line DL1 is supplied with the reference potential generated by the reference potential generating circuit RC. After that, the sense amplifier 11 amplifies the potential difference between the sense node DL and the reference node REF to thereby sense read data. The sense data SAout is applied to the output buffer 13, which responds to the output enable signal /OE to output read data Dout.

As described above, the operation of the output buffer 13 is controlled by the output enable signal /OE. Assume that, at data read time, the signal /OE is activated during the period when the sense amplifier 11 is operating, noise is generated in the output buffer 13 and enters the sense amplifier 11, and both the sense node DL and the reference node REF are overcharged as described previously.

In the semiconductor memory of this embodiment, the load capacitance associated with the sense node DL of the sense amplifier 11 at data read time is the sum of the common data line capacitance (capacitance associated with DL0), the gate capacitance and the junction capacitance of the column gate circuit 5, and the bit line capacitance. On the other hand, the load capacitance associated with the reference node REF of the sense amplifier 11 is the sum of the common data line capacitance (capacitance associated with DL1), the gate capacitance and the junction capacitance of the column gate circuit 6, and the dummy bit line capacitance.

That is, at data read time, the sense node DL and the reference node REF are set to be substantially equal to each other in load capacitance. Even if both the sense node DL and the reference node REF are overcharged, therefore, the degrees to which the respective nodes are overcharged are substantially equal to each other. As a result, the sense data SAout of the sense amplifier is prevented from being inverted temporarily and hence, unlike the conventional memory, the elongation of access time is prevented.

Here, of various capacitances associated with the nodes DL and REF, the capacitance associated with the common data line DL0 or DL1 is the greatest, which is about twice the sum of the other capacitances.

In order to make the load capacitances of the respective nodes DL and REF substantially equal to each other at data read time, the common data line capacitance on the non-selected memory core side is used, which eliminates the need of provision of an additional circuit for adding a dummy capacitance corresponding to the large common data line capacitance; thus, it becomes possible to prevent an increase in the chip area when the memory is integrated.

In addition, as described previously, the data line switch circuit 10 is controlled through the use of a portion of an output signal of the address buffer 9, thus simplifying the circuit arrangement.

Figure 3:
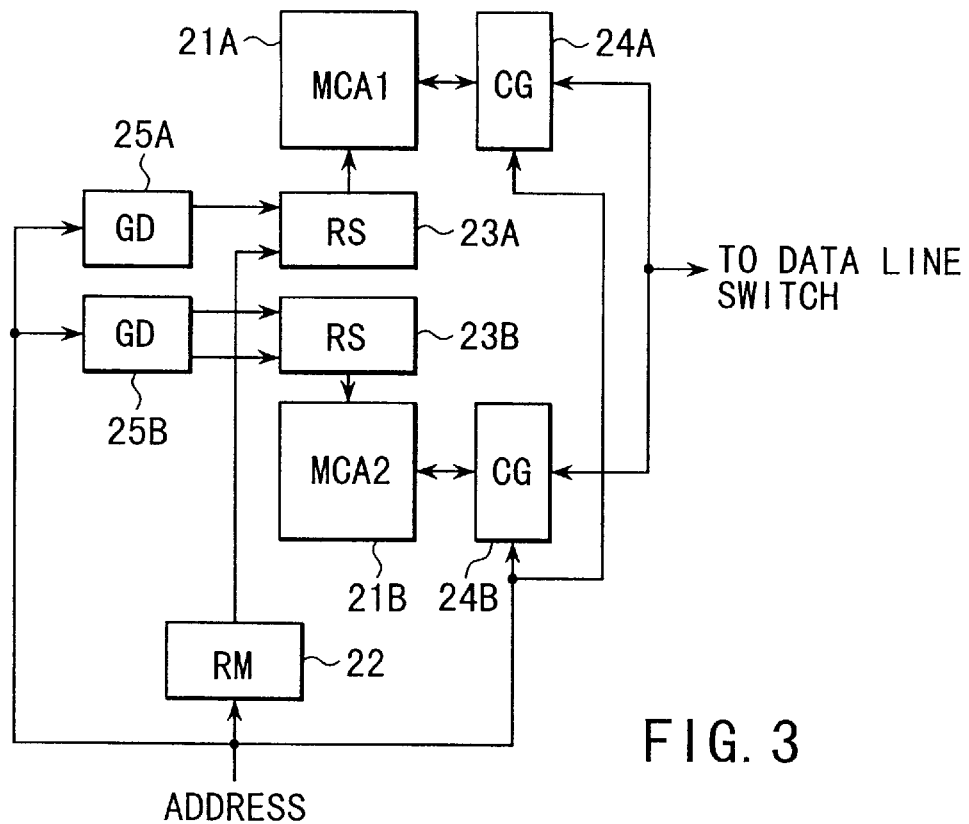
FIG. 3 is a block diagram illustrating an arrangement of the memory core in the semiconductor memory of FIG. 2.

Next, specific arrangements of main portions of the semiconductor memory shown in FIG. 2 will be described. FIG. 3 is a block diagram of each of the memory cores 1 and 2 except their respective dummy cell circuits 14 and 15.

Each of the memory cell arrays 3 and 4 is divided into two memory cell arrays (MCA1, MCA2) 21A and 21B each with 512k number of memory cells by way of example. Each of the row decoders 7 and 8 is constructed from a row main decoder (RM) 22 and two row sub-decoders (RS) 23A and 23B.

Each of the column gate circuits 5 and 6 has a plurality of transistors connected in a tree form and is divided into two column gate circuits (CG) 24A and 24B each of which makes a selection from bit lines in a corresponding one of the memory cell arrays 21A and 21B.

Two control gate drivers (GD) 25A and 25B are provided each of which drives a word line in the corresponding one of the memory cell arrays 21A and 21B through the corresponding one of the row sub-decoders 23A and 23B selected by the row main decoder 22.

Figure 4:
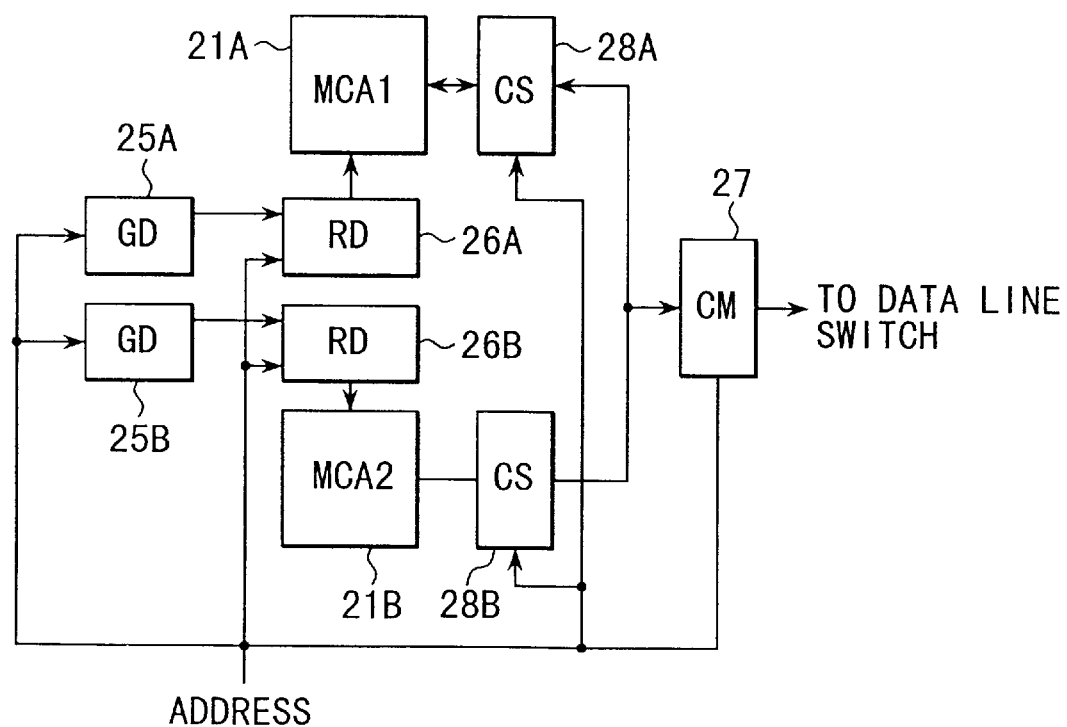
FIG. 4 is a block diagram illustrating another arrangement of the memory core in the semiconductor memory of FIG. 2.

FIG. 4 shows, in block diagram form, each of the memory cores 1 and 2 except the dummy cell circuits 14 and 15. The block diagram of FIG. 4 differs from that of FIG. 3. Although, in FIG. 3, each of the row decoders 7 and 8 is composed of the row main decoder 22 and the two row sub-decoders 23A and 23B, in FIG. 4, only two row decoders (RD) 26A and 26B are provided each of which corresponds to a respective one of the memory cell arrays 21A and 21B. In this example, each of the column gate circuits 5 and 6 is constructed from a column main gate circuit (CM) 27 and two column sub-gate circuits (CS) 28A and 28B, one for each of the memory cell arrays 21A and 21B.

Figure 5:
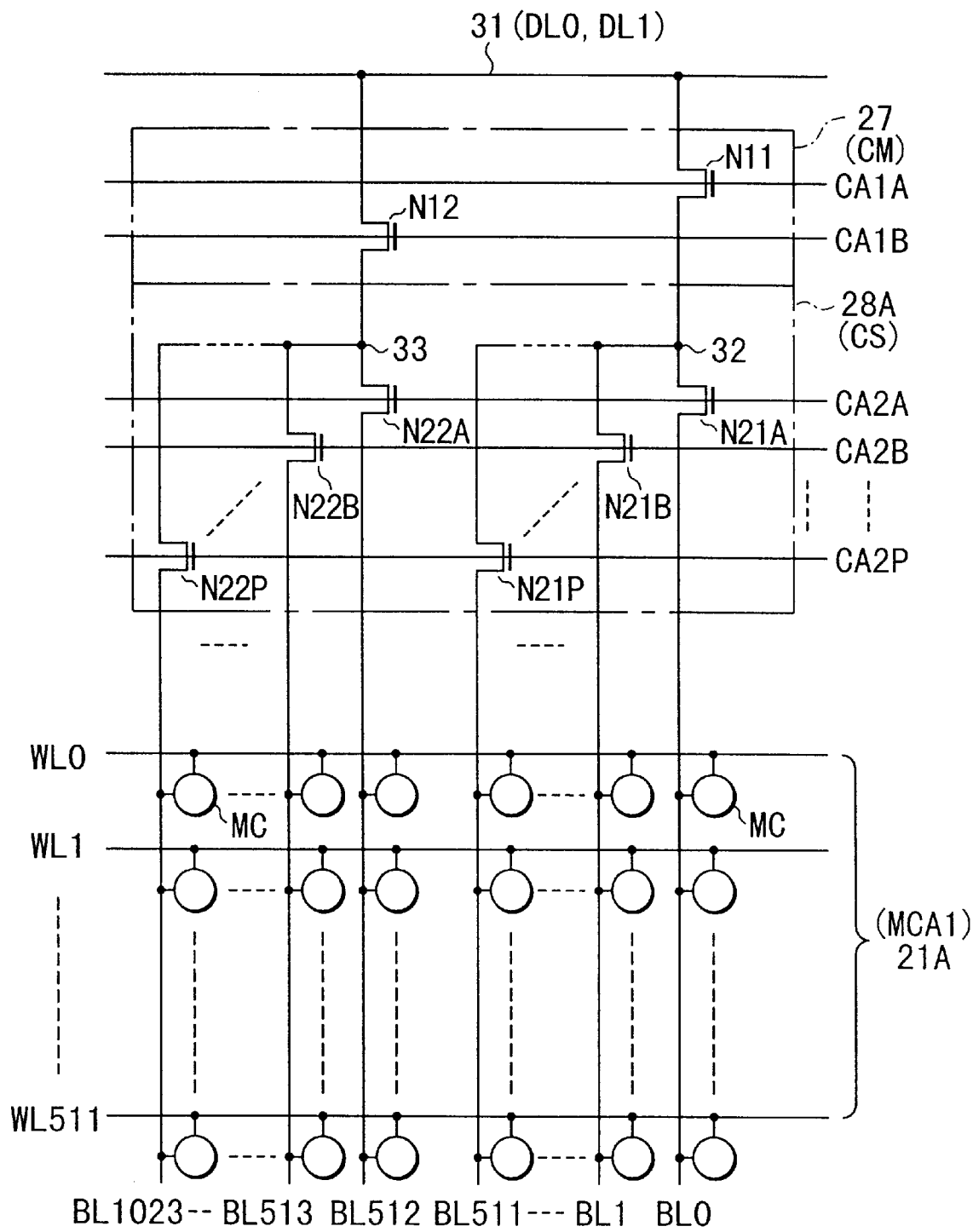
FIG. 5 shows specific arrangements of the memory cell array and the column gate circuit in the semiconductor memory of FIG. 2.

FIG. 5 illustrates a specific arrangement of the column main gate circuit 27 and the column sub-gate circuit 28A together with the memory cell array (MCA1) 21A.

In the memory cell array 21A, for example, 512 word lines WL0 to WL511 and 1024 bit lines BL0 to BL1023 are arranged so as to intersect. At each intersection of word and bit lines is placed a memory cell MC of the same type as the reference cell in the reference potential generating circuit RC shown in FIG. 2. The gates of memory cells MC arranged in each row are connected in common to a corresponding word line, while the drains of memory cells arranged in each column are connected in common to a corresponding bit line. The memory cells have their sources connected to a node at a fixed potential, such as ground.

The column main gate circuit 27 is composed of an N-channel MOS transistor N11 having its source-drain path connected between a node 31 connected to the common data line DL0 or DL1 and a node 32 in the column sub-gate circuit 28A and an N-channel MOS transistor N12 having its source-drain path connected between the node 31 and a node 33 in the column sub-gate circuit 28A. The gates of the transistors N11 and N12 are connected to receive column address signals CA1A and CA1B, respectively, which are generated by the address buffer 9.

The column sub-gate circuit 28A is constructed from a first group of N-channel MOS transistors N21A, N21B, . . . , N21P each having their respective source-drain path connected between the node 32 and a corresponding one of the bit lines BL0, BL1, . . . , BL511 and a second group of N-channel MOS transistors N22A, N22B, . . . , N22P each having their respective source-drain path connected between the node 33 and a corresponding one of the bit lines BL512, BL513, . . . , BL1023. Of the first and second groups of transistors, the transistors N21A and N22A connected to the bit lines BL0 and BL512 have their respective gates connected to receive a column address signal CA2A generated by the address buffer 9. The transistors N21B and N22B connected to the bit lines BL1 and BL513 have their respective gates connected to receive a column address signal CA2B generated by the address buffer 9. In this manner, each pair of transistors connected to two different corresponding bit lines has their respective gates connected to receive a column address signal.

That is, the column gate circuits (CG) 27, and 28A and 28B are constructed from a number of transistors connected in a tree form. A selection is made from among the bit lines BL0 to BL1023 by column address signals.

Figure 6:
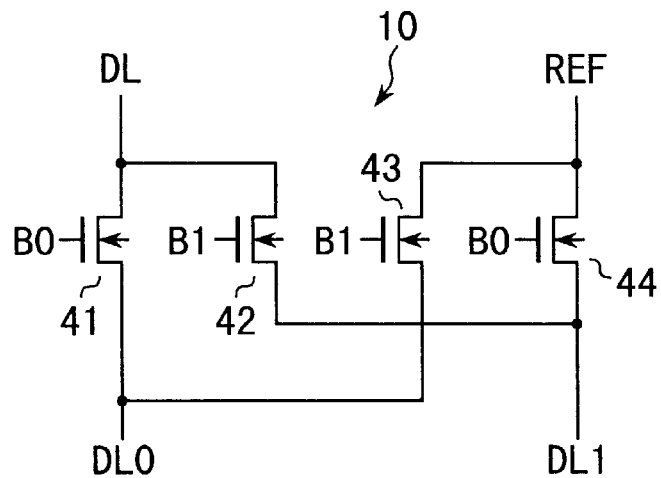
FIG. 6 shows a specific arrangement of the data line switch circuit of the semiconductor memory of FIG. 2.

FIG. 6 shows a specific circuit arrangement of the data line switch circuit 10 of FIG. 2, which comprises four N-channel MOS transistors 41 to 44. The MOS transistor 41 has its source-drain path inserted between the sense node DL of the sense amplifier 11 and the common data line DL0 of the memory core 1 and its gate connected to receive a decode output B0 of the data line decoder 12. The MOS transistor 42 has its source-drain path inserted between the sense node DL of the sense amplifier 11 and the common data line DL1 of the memory core 2 and its gate connected to receive a decode output B1 of the data line decoder 12. The MOS transistor 43 has its source-drain path inserted between the reference node REF of the sense amplifier 11 and the common data line DL0 of the memory core 1 and its gate connected to receive the decode output B1 of the data line decoder 12. The MOS transistor 44 has its source-drain path inserted between the reference node REF of the sense amplifier 11 and the common data line DL1 of the memory core 2 and its gate connected to receive the decode output B0 of the data line decoder 12.

The decode outputs B0 and B1 of the data line decoder 12 act as memory block address signals such that, when the memory core 1 is selected, B0 is set high and B1 is set low and, when the memory core 2 is selected, B0 is set low and B1 is set high.

In the data line switch circuit 10 thus arranged, when the memory block address signal B0 is high, the MOS transistors 41 and 44 are turned on, thereby connecting the common data line DL0 on the memory core 1 side to the sense node DL of the sense amplifier 11 and the common data line DL1 on the memory core 2 side to the reference node REF of the sense amplifier 11.

On the other hand, when the memory block address signal B1 is at a high level, the MOS transistors 42 and 43 are turned on, thereby connecting the common data line DL0 associated with the memory core 1 to the reference node REF of the sense amplifier 11 and the common data line DL1 associated with the memory core 2 to the sense node DL of the sense amplifier 11.

Figure 7:
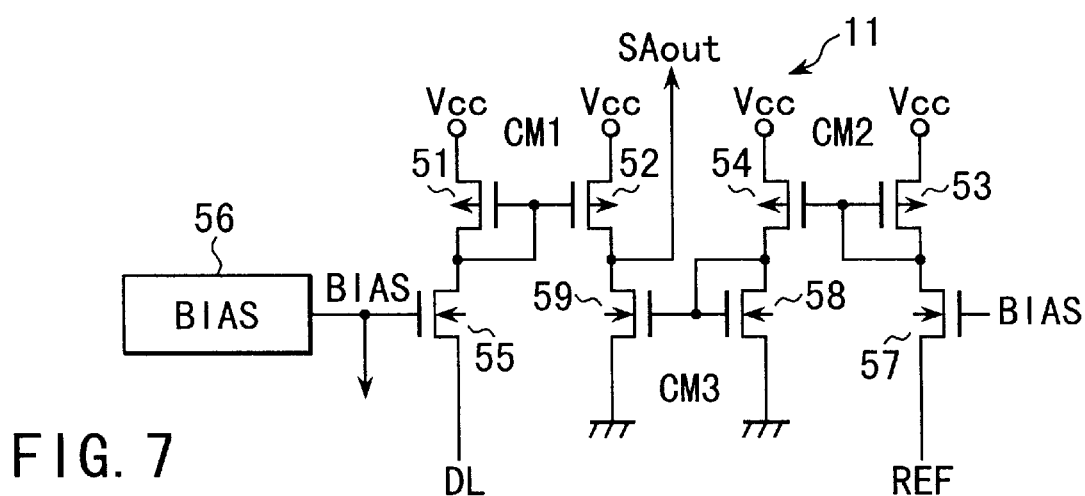
FIG. 7 shows a specific arrangement of the sense amplifier of the semiconductor memory of FIG. 2.

FIG. 7 shows a specific arrangement of the sense amplifier 11 shown in FIG. 2. The sense amplifier has first, second and third current mirror circuits CM1, CM2, and CM3.

The first current mirror circuit CM1 is formed from two P-channel MOS transistors 51 and 52, which have their respective sources connected to a supply node for supply voltage Vcc and their respective gates connected together to the drain of the MOS transistor 51. In this current mirror circuit CM1, the drain of the transistor 51 provides the current input terminal, while the drain of the transistor 52 provides the current output terminal.

The second current mirror circuit CM2 is formed from two P-channel MOS transistors 53 and 54, which have their respective sources connected to the supply node for supply voltage Vcc and their respective gates connected together to the drain of the MOS transistor 53. In this current mirror circuit CM2, the drain of the transistor 53 provides the current input terminal, while the drain of the transistor 54 provides the current output terminal.

Between the drain of the MOS transistor 51 which is the current input terminal of the first current mirror circuit CM1 and the sense node DL which is one of the input nodes of the sense amplifier is connected the source-drain path of a voltage clamping N-channel MOS transistor 55, which has its gate connected to receive a bias voltage BIAS lower than the supply voltage Vcc and generated by a bias circuit 56.

Between the drain of the MOS transistor 53 which is the current input terminal of the second current mirror circuit CM2 and the reference node REF which is the other of the input nodes of the sense amplifier is connected the source-drain path of a voltage clamping N-channel MOS transistor 57, which has its gate connected to receive the bias voltage BIAS.

The third current mirror circuit CM3 is formed from two N-channel MOS transistors 58 and 59, which have their respective sources connected to a supply node for ground potential and their respective gates connected together to the drain of the MOS transistor 58. In this current mirror circuit CM3, the drain of the transistor 58 provides the current input terminal, while the drain of the transistor 59 provides the current output terminal. The current input terminal of the third current mirror circuit CM3 has its current input terminal connected to the current output terminal of the second current mirror circuit CM2 and its current output terminal connected to the current output terminal of the first current mirror circuit CM1. The sense data SAout is taken at the common connection node of the current output terminals of the first and third current mirrors circuits CM1 and CM3.

In the sense amplifier thus arranged, the supply voltage Vcc is prevented from being applied directly to the sense node DL and the reference node REF by setting the bias voltage BIAS lower than the supply voltage Vcc. Thus, a voltage much lower than the supply voltage Vcc will be applied to the bit lines in the memory cores 1 and 2, thereby controlling the generation of so-called soft errors in the memory cells connected to the bit lines.

Next, the data sense operation of the sense amplifier will be described.

For example, suppose now that a potential corresponding to read data from a memory cell is applied to the sense node DL. The reference node REF is supplied with the reference potential, which is set to be nearly midway between the potential at the sense node DL when a data "1" is read from a memory cell and the potential at the sense node when a data "0" is read.

When a data "0" is read out, the potential at the sense node DL is made higher than the potential at the reference node REF, which makes the current in the MOS transistor 54 higher than that in the MOS transistor 52. As a result, sense data SAout at a low level corresponding to ground potential is output.

When a data "1" is read out, on the other hand, the potential at the sense node DL is made lower than the potential at the reference node REF, which makes the current in the MOS transistor 54 lower than that in the MOS transistor 52. As a result, sense data SAout at a high level corresponding to the supply voltage is output.

As described previously, even if, at data read time, noise increases temporarily the magnitude of the bias voltage BIAS generated by the bias circuit 56 by tens of millivolts, the sense data SAout will not be inverted temporarily because the sense node DL and the reference node REF are substantially equal to each other in load capacitance and hence the degrees to which the potentials at the sense node and the reference node increase are substantially equal to each other.

Figure 8A:
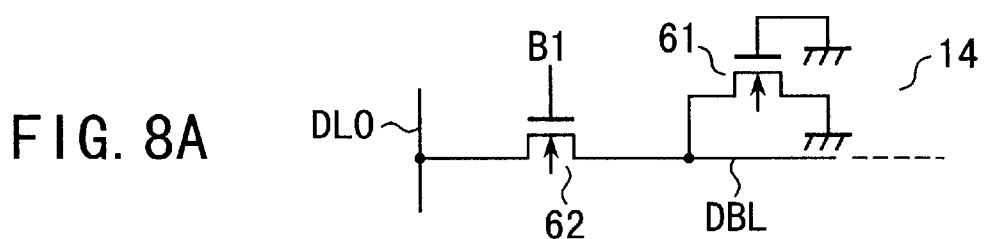
FIG. 8A shows a specific arrangement of the dummy cell circuit provided in the one memory core of the semiconductor memory of FIG. 2.
Figure 8B:
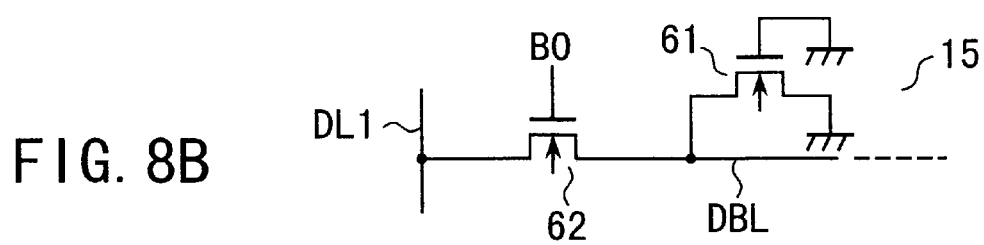
FIG. 8B shows a specific arrangement of the dummy cell circuit provided in the other memory core of the semiconductor memory of FIG. 2.

FIG. 8A shows a specific arrangement of the dummy cell circuit 14 in the memory core 1 shown in FIG. 2, while FIG. 8B shows a specific arrangement of the dummy cell circuit 15 in the memory core 2.

In FIG. 8A, DBL denotes a dummy bit line. To the dummy bit line DBL are connected as many dummy cells 61 as there are memory cells that are connected to each bit line (only one dummy cell is shown for simplicity in the figure). The dummy cells 61 are configured the same as the memory cells. In this example, an N-channel MOS transistor is used which has its source and gate connected to ground.

Between the dummy bit line DBL and the common data line DL0 is connected the source-drain path of an N-channel MOS transistor 62, which has its gate connected to the previously described memory block address signal B1.

The dummy cell circuit 15 of FIG. 8B differs from that of FIG. 8A only in that the common data line DL0 changes to DL1 and the memory block address signal B1 to the gate of MOS transistor 62 changes to B0 and therefore description thereof is omitted.

When the column gate circuits 5 and 6 are arranged such that two N-channel MOS transistors are connected in series as shown in FIG. 5 and there is a rigid requirement for a match between the reference node and the sense node in load capacitance, it is required only that two MOS transistors be connected in series in place of the single MOS transistor 62 in FIGS. 8A and 8B.

When, in the data line switch circuit shown in FIG. 6, the signal B0 goes high and a potential corresponding to data from a selected memory in the memory core 1 is supplied to the common data line DL0, in the circuit of FIG. 8B the MOS transistor 62 is turned on by the signal B0, so that the dummy bit line DBL in the memory core 2 is connected to the common data line DL1.

In contrast to the above, when the signal B1 goes high and a potential corresponding to data from a selected memory in the memory core 2 is supplied to the common data line DL1, in the circuit of FIG. 8A the MOS transistor 62 is turned on by the signal B1, so that the dummy bit line DBL in the memory core 1 is connected to the common data line DL0.

Figure 9:
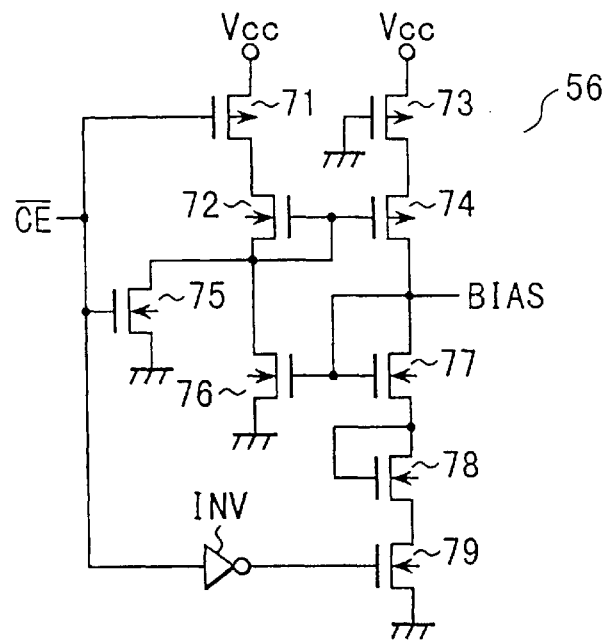
FIG. 9 shows a specific arrangement of the bias circuit shown in FIG. 7.

FIG. 9 shows a specific arrangement of the bias circuit 56 in FIG. 7, which is constructed from four P-channel MOS transistors 71 to 74, five N-channel MOS transistors 75 to 79, and an inverter INV.

In the bias circuit 56, when the chip enable signal /CE is activated (i.e., goes low), the MOS transistors 71 and 79 are turned on and the MOS transistor 75 is turned off, so that the circuit enters the working state, i.e., is enabled to output the bias voltage BIAS. In the working state, the current flowing through the series-connected transistors 77 and 78 is made constant by a current mirror composed of the MOS transistors 72 and 74 and a current mirror composed of the MOS transistors 76 and 77. As a result, the constant bias voltage BIAS corresponding to the sum of threshold voltages of the respective MOS transistors 77 and 78 is taken at the connection node between the MOS transistors 74 and 77.

When the chip enable signal /CE is deactivated (i.e., goes high), on the other hand, the MOS transistors 71 and 79 are turned off, so that no current flows in the bias circuit. Thus, current dissipation is reduced. At this point, the output node of the bias voltage BIAS is left floating.

Figure 10:
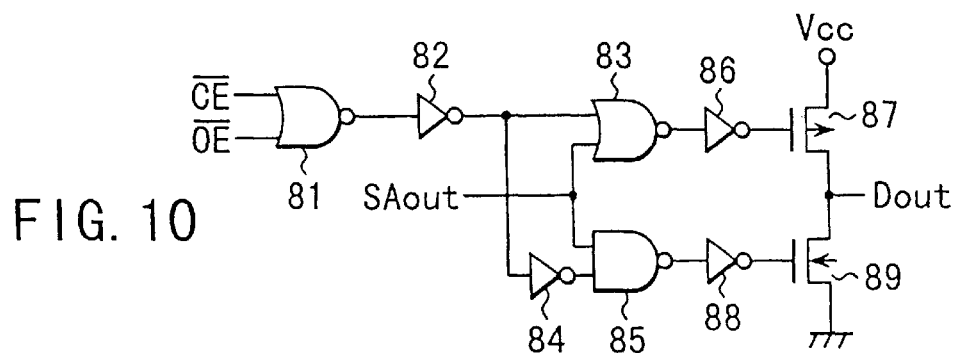
FIG. 10 shows a specific arrangement of the output buffer of the semiconductor memory of FIG. 2.

FIG. 10 shows a specific arrangement of the output buffer 13 in FIG. 2. In this circuit, the chip enable signal /CE and an output enable signal /OE are applied to the inputs of a two-input NOR gate 81, which has its output coupled to the input of an inverter 82. The inverter 82 has its output coupled to an input of a two-input NOR gate 83 and to an input of a two-input NAND gate 85 through an inverter 84. The other input of the NOR gate 83 and the other input of the NAND gate 85 are connected to receive the sense data SAout of the sense amplifier 11.

The output of the NOR gate 83 is coupled through an inverter 86 to the gate of an output P-channel MOS transistor 87. The output of the NAND gate 85 is coupled through an inverter 88 to the gate of an output N-channel MOS transistor 89. The MOS transistors 87 and 89 have their sources connected to supply voltage Vcc and ground, respectively, and their drains connected together. Data Dout is taken at the common drains of these transistors.

In the circuit thus arranged, when both the chip enable signal /CE and the output enable signal /OE are activated, the output of the NOR gate 81 goes high, the output of the succeeding inverter 82 goes low, and the output of the inverter 84 goes high.

When the sense data SAout is low, the output of the NOR gate 83 is high and the output of the inverter 86 is low, thus turning on the MOS transistor 87. Further, the output of the NAND gate 85 is high and the output of the inverter 86 is low, turning off the MOS transistor 89. Therefore, when the sense data SAout is at a low level, data Dout at a high level is output.

In contrast, when the sense data SAout is high, the output of the NOR gate 83 is low and the output of the inverter 86 is high, thus turning off the MOS transistor 87. The output of the NAND gate 85 is low and the output of the inverter 86 is high, turning on the MOS transistor 89. Therefore, when the sense data SAout is at a high, data Dout at a low level is output.

When either or both of the chip enable signal /CE and the output enable signal /OE are deactivated (low), the output of the NOR gate 81 is high, the output of the inverter 82 is low, the output of the inverter 84 is high, the output of the NOR gate 83 is low, and the output of the inverter 86 is high, thus turning off the MOS transistor 87. Further, the output of the NAND gate 85 is high and the output of the inverter 86 is low, thus turning off the MOS transistor 89. At this point, therefore, the output node of data Dout is in the high-impedance state, i.e., floating state, irrespective of the level of sense data SAout.

Figure 11A:
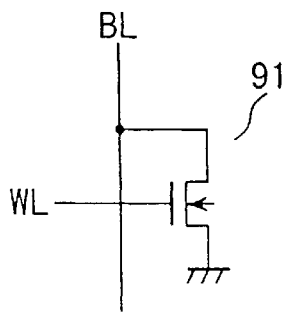
FIG. 11A shows a circuit arrangement of the memory cells in the memory cell arrays of FIG. 2.
Figure 11B:
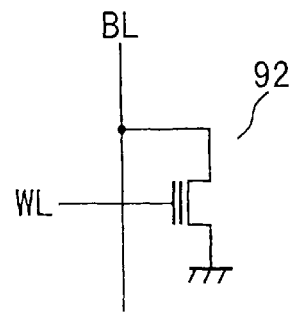
FIG. 11B shows another circuit arrangement of the memory cell in the memory cell arrays of FIG. 2.

FIGS. 11A and 11B show arrangements of a memory cell in the memory cell array 3 or 4 in FIG. 2.

A memory cell 91 shown in FIG. 11A consists of an N-channel MOS transistor. Data programming is performed by making a difference in threshold voltage between a data "0" and a data "1" by changing the density of impurities ion-implanted into the channel region of each memory cell transistor during the manufacturing process. The memory cell transistor 91 has its source connected to ground, its drain connected to a corresponding one of the bit lines BL, and its gate connected to a corresponding one of the word lines WL. A semiconductor memory using such memory cells is a mask ROM.

A memory cell 92 shown in FIG. 11B consists of a non-volatile transistor having a floating gate and a control gate. With this type of memory cell, data programming is performed by either injecting charges into the floating gate or removing charges stored on the floating gate using a data write circuit. The memory cell transistor 92 has its source connected to ground, its drain connected to a corresponding one of the bit lines BL, and its control gate connected to a corresponding one of the word lines WL. A semiconductor memory having such memory cells is a flash memory.

Where such a cell as shown in FIG. 11A or FIG. 11B is used as each one of the memory cells in the memory cell arrays 3 and 4, the reference cell shown in FIG. 2 and the dummy cell 61 used in the dummy cell circuit shown in FIGS. 8A and 8B are of the same type as the memory cell 91 or 92.

Figure 12:
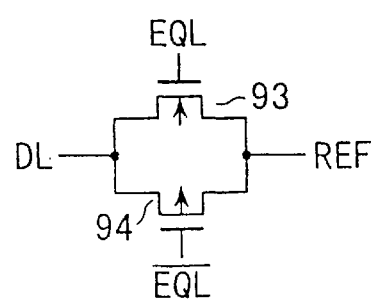
FIG. 12 shows a circuit arrangement of an equalize circuit provided between the sense node and the reference node of the sense amplifier in the semiconductor memory of FIG. 2.

FIG. 12 shows an arrangement of an equalizer circuit provided between the sense node DL and the reference node REF of the sense amplifier 11.

Before the potential difference between the common data lines DL0 and DL1 is amplified by the sense amplifier 11 to sense read data, both the lines DL0 and DL1 are charged to an equal potential. During the period when the common data lines are charged, the sense amplifier cannot output correct data. Therefore, the state of the common data lines during their charging period is not significant. It is required to shorten the charging period of the common data lines and eliminate the potential difference between the common data lines by positively short-circuiting the common data lines during the charging period.

The equalizer shown in FIG. 12 is adapted to short-circuit the common data lines and comprises an N-channel MOS transistor 93 and a P-channel MOS transistor 94 having their respective source-drain paths connected in parallel between the sense node DL and the reference node REF of the sense amplifier 11. The MOS transistor 93 has its gate connected to receive an equalize signal EQL, while the MOS transistor 94 has its gate connected to receive a signal /EQL which is the inverse of the equalize signal EQL.

With this equalizer, the signal EQL is set high and the signal /EQL is set low during the charging period of the common data lines DL0 and DL1. As a result, both the MOS transistors 93 and 94 are turned on, short-circuiting the common data lines DL0 and DL1.

Figure 13:
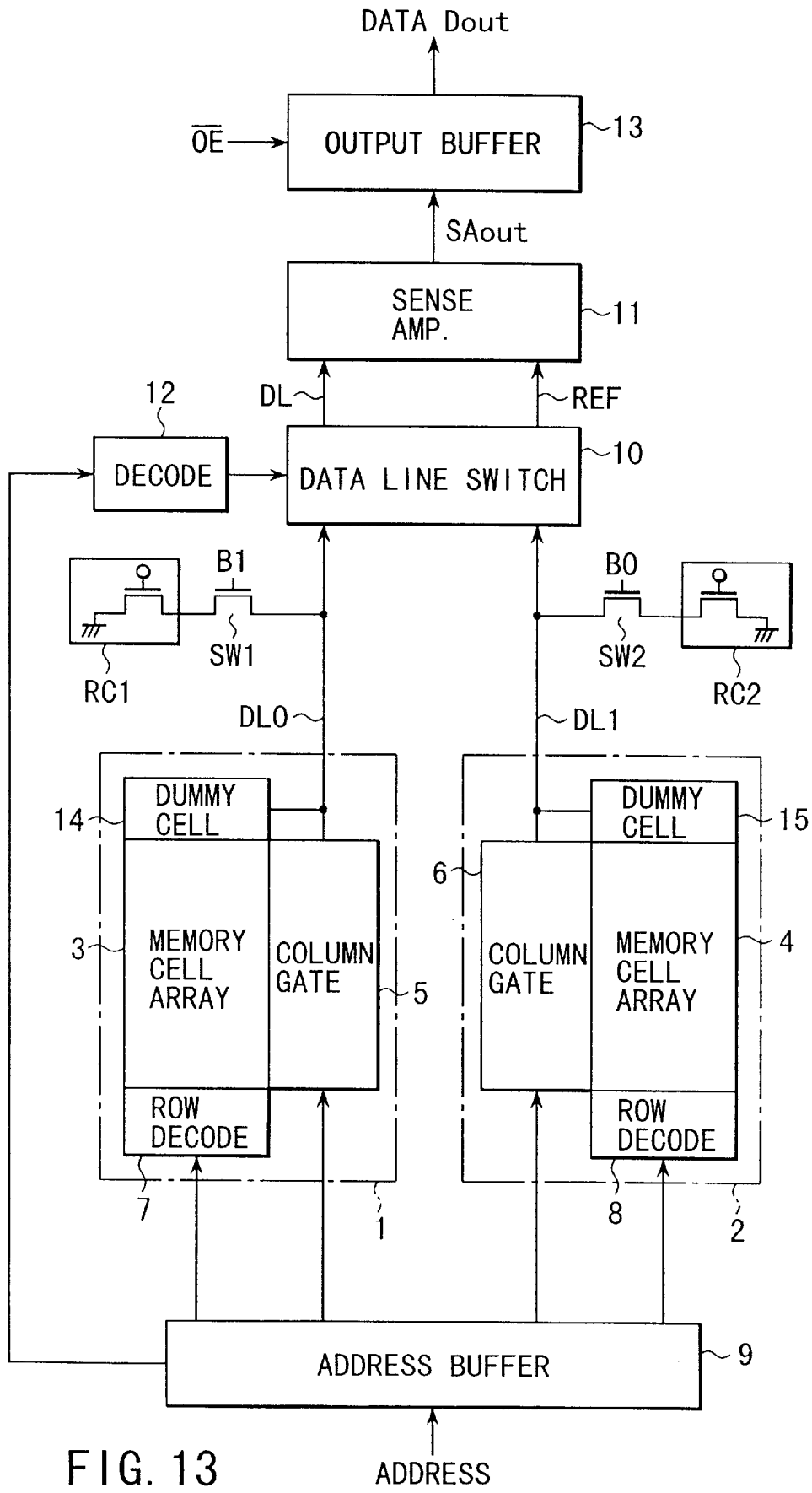
FIG. 13 is a block diagram illustrating the entire configuration of a semiconductor memory according to a second embodiment of the present invention.

In FIG. 13, there is illustrated, in block diagram form, the entire configuration of a semiconductor memory according to a second embodiment of the present invention. In the first embodiment shown in FIG. 2, the reference potential generating circuit RC is connected to the reference node REF of the sense amplifier 11. In contrast, in the second embodiment, two reference potential generating circuits RC1 and RC2 are provided. The reference potential generating circuit RC1 is connected to the common data line DL0 of the memory core 1 by a switching MOS transistor SW1. The reference potential generating circuit RC2 is connected to the common data line DL1 of the memory core 2 by a switching MOS transistor SW2.

The reference potential generating circuits RC1 and RC2 are each provided with a reference memory cell that is of the same type as each memory cell in the memory cell arrays 3 and 4.

The switching MOS transistor SW1 is rendered conductive by the signal B1 which causes the data switch circuit 10 to connect the common data line DL1 of the memory core 2 to the sense node DL of the sense amplifier 11 and connect the common data line DL0 of the memory core 1 to the reference node REF of the sense amplifier. Likewise, the switching MOS transistor SW2 is rendered conductive by the signal B0 which causes the data line switch circuit 10 to connect the common data line DL0 of the memory core 1 to the sense node DL of the sense amplifier 11 and connect the common data line DL1 of the memory core 2 to the reference node REF of the sense amplifier.

Figure 14:
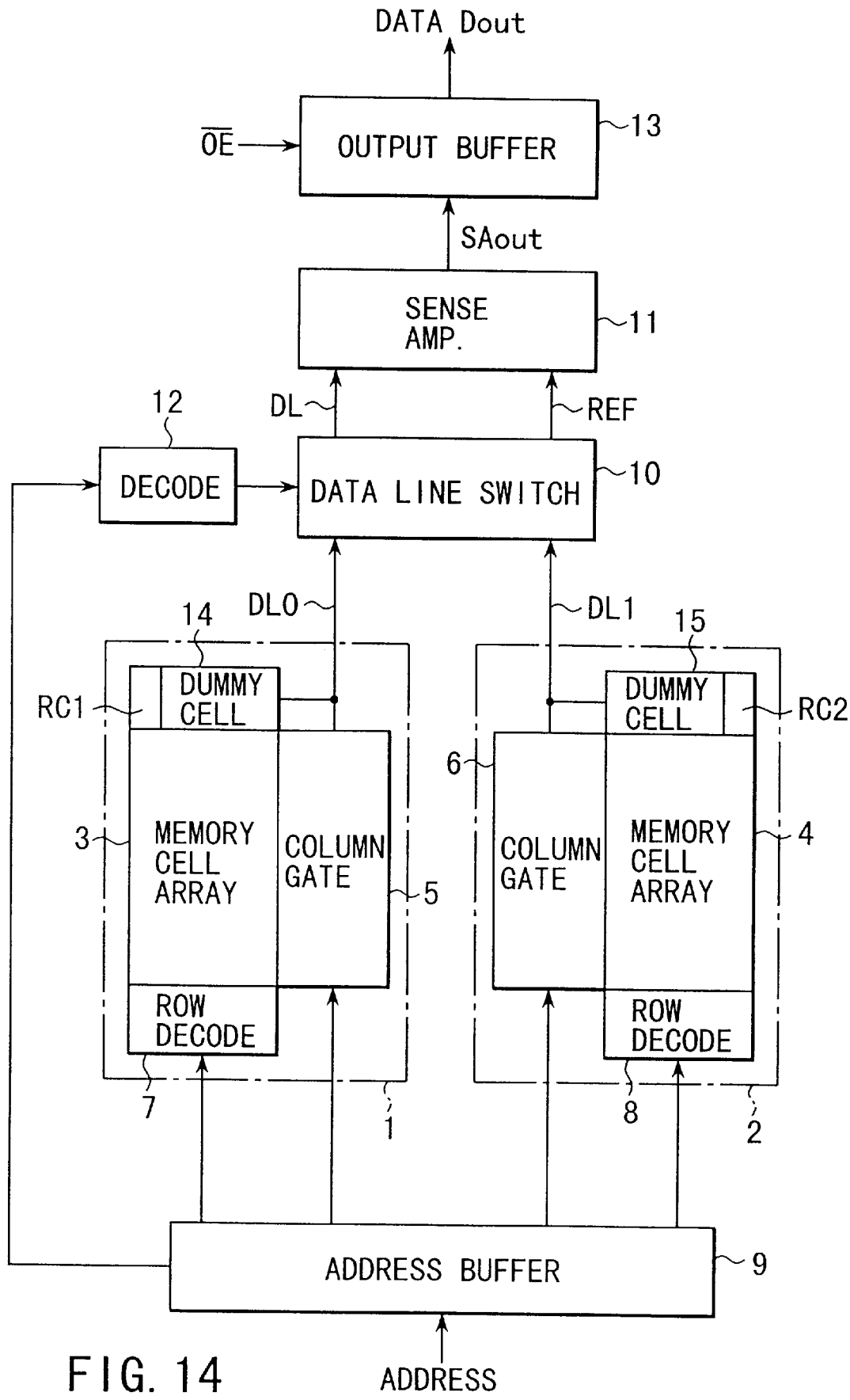
FIG. 14 is a block diagram illustrating the entire configuration of a semiconductor memory according to a third embodiment of the present invention.

In FIG. 14, there is illustrated, in block diagram form, the entire configuration of a semiconductor memory according to a third embodiment of the present invention. In this embodiment as well, two reference potential generating circuits RC1 and RC2 are provided. The reference potential generating circuit RC1 is located next to the dummy cell circuit 14 in the memory core 1, while the reference potential generating circuit RC2 is located next to the dummy cell circuit 15 in the memory core 2.

Figure 15A:
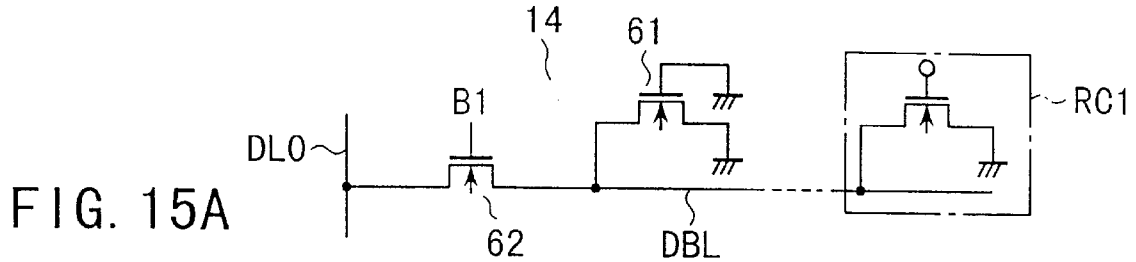
FIG. 15A shows specific arrangements of the dummy cell circuit and the reference potential generating circuit provided in the one memory core of the semiconductor memory of FIG. 14.
Figure 15B:
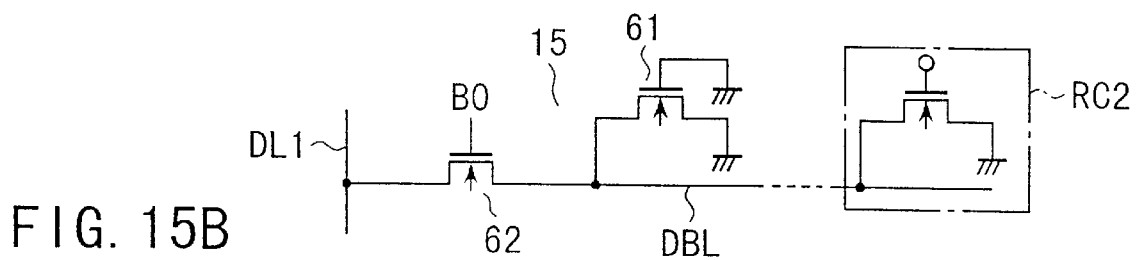
FIG. 15B shows specific arrangements of the dummy cell circuit and the reference potential generating circuit provided in the other memory core of the semiconductor memory of FIG. 14.

FIGS. 15A and 15B show specific arrangements of the dummy cell circuits and the reference potential generating circuits shown in FIG. 14.

The dummy cell circuit shown in FIG. 15A is arranged identically to that shown in FIG. 8A. The reference potential generating circuit RC1 is connected to the dummy bit line DBL of the dummy cell circuit 14. With this arrangement, when the transistor 62 is rendered conductive by the control signal B1 to connect the dummy bit line DBL to the common data line DL0 of the memory core 1, the reference potential generating circuit RC1 is also connected to the common data line DL0, so that the data line DL0 is supplied with the reference potential.

The dummy cell circuit shown in FIG. 15B is arranged identically to that shown in FIG. 8B. The reference potential generating circuit RC2 is connected to the dummy bit line DBL of the dummy cell circuit 15. With this arrangement, when the transistor 62 is rendered conductive by the control signal B0 to connect the dummy bit line DBL to the common data line DL1 of the memory core 2, the reference potential generating circuit RC2 is also connected to the common data line DL1, so that the data line DL1 is supplied with the reference potential.

Figure 16:
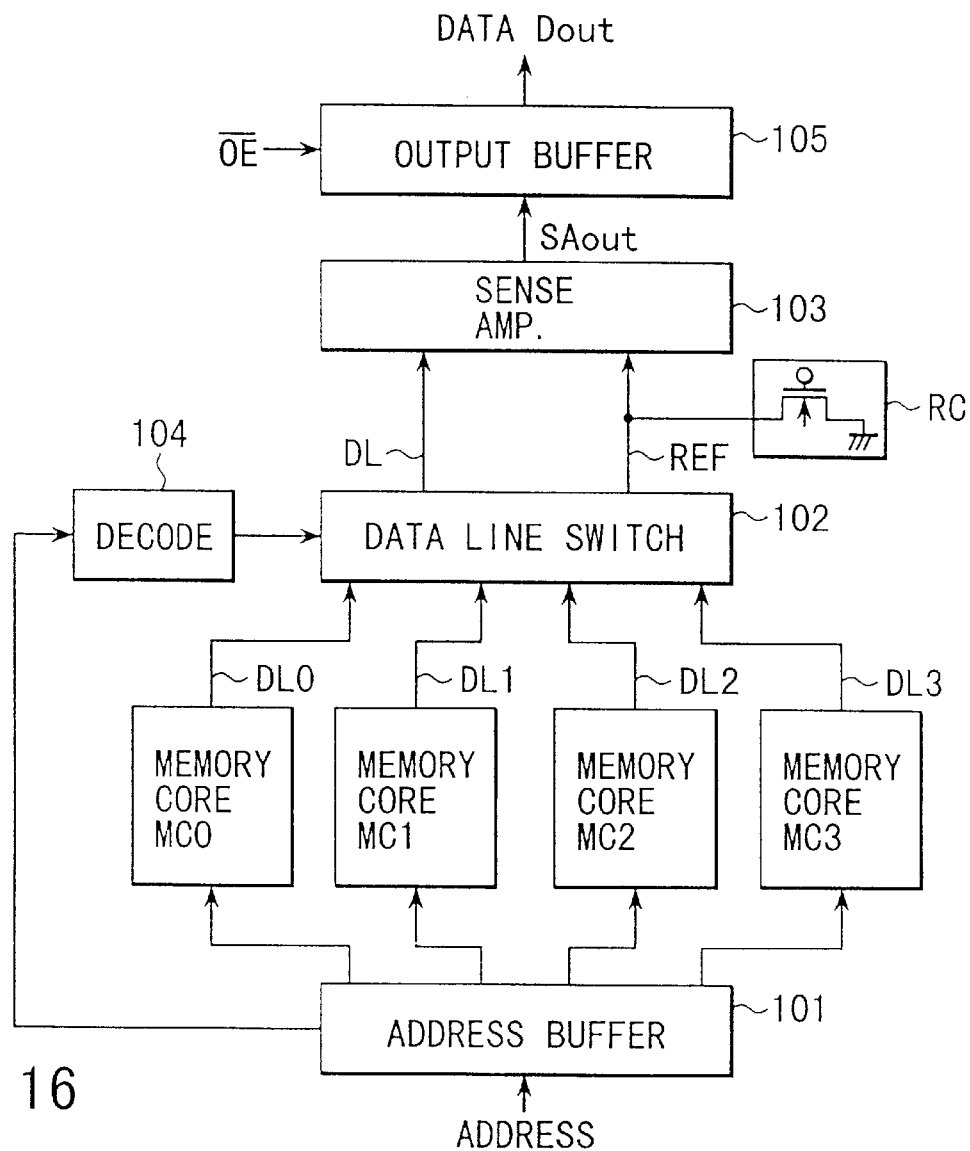
FIG. 16 is a block diagram illustrating the entire configuration of a semiconductor memory according to a fourth embodiment of the present invention.

In FIG. 16, there is illustrated, in block diagram form, the entire configuration of a semiconductor memory according to a fourth embodiment of the present invention. Although the first embodiment was described as comprising two memory cores, the fourth embodiment is provided with n number of memory cores (n=4 in this example). These four memory cores are indicated at MC0, MC1, MC2, and MC3.

Though not shown, the memory cores MC0 to MC3 are each provided with a memory cell array, a column gate circuit, a row decoder, and a dummy cell circuit as in the case of FIG. 2.

Reference numeral 101 denotes an address buffer which is responsive to an externally applied address signal to generate an internal address signal, which is in turn applied to the column gate circuits and the row decoders in the memory cores MC0 to MC3.

In a data line switch circuit 102, common data lines DL0 to DL3 of the respective memory cores MC0 to MC3 are selected to be connected to either of the sense node DL and the reference node REF of a sense amplifier 103. The operation of the data line switch circuit 102 is controlled by an output of a data line decoder 103 which decodes a portion of an internal address signal generated by the address buffer 101.

As with the sense amplifier 11, the sense amplifier 103 amplifies the potential difference between the sense node DL and the reference node REF to sense data at data read time and outputs sense data SAout, which is in turn applied to an output buffer 105. To the reference node REF of the sense amplifier 103 is connected a reference potential generating circuit RC.

To drive large load capacitance associated with a data output terminal, the output buffer 105 is provided with a large output transistor at its output stage. Upon receipt of sense data SAout, the output buffer outputs data Dout corresponding to the input data.

Each of the memory cores MC0 to MC3 is provided with a dummy cell circuit which furnishes load capacitance to the reference node REF of the sense amplifier 103 when it senses data. Each dummy cell circuit, when its corresponding memory core is not selected at data read time, is connected to the corresponding common data line.

For example, in reading from the memory core MC0, a memory cell in that memory core is selected by the corresponding column gate circuit and row decoder circuit and the bit line connected to the selected memory cell is connected to the common data line DL0 through the column gate circuit. Thus, data read from the selected memory is transferred to the common data line DL0 through the bit line and the column gate circuit in the memory core MC0.

At this point, in the non-selected memory core MC1, the dummy cell circuit with multiple dummy cells is connected to the common data line DL1. For this reason, the load capacitance associated with the common data line DL1 becomes substantially equal to the load capacitance associated with the common data line DL0 onto which data is read out.

Further, the data line switch circuit 102, in response to a decode output of the data line decoder 104, connects the common data line DL0 of the memory core MC0 to the sense node DL of the sense amplifier 103 and the common data line DL1 of the memory core MC1 to the reference node REF. The reference node REF is supplied with the reference potential from the reference potential generating circuit RC. The sense amplifier 103 amplifies the potential difference between the sense node DL and the reference node REF and then provides sense data SAout to the output buffer 105, which in turn outputs read data Dout.

As shown in TABLE 1 below, in reading from the memory core MC1, the common data line DL1 of the memory core MC1 is connected to the sense node DL of the sense amplifier 103 and the common data line DL0 of the memory core MC0 is connected to the reference node REF by the data line switch circuit 102. Likewise, in reading from the memory core MC2, the common data line DL2 of the memory core MC2 is connected to the sense node DL of the sense amplifier 103 and the common data line DL3 of the memory core MC3 is connected to the reference node REF. Likewise, in reading from the memory core MC3, the common data line DL3 of the memory core MC3 is connected to the sense node DL of the sense amplifier 103 and the common data line DL2 of the memory core MC2 is connected to the reference node REF.

TABLE 1

| SELECTED MEMORY CORE | NODE DL | NODE REF |
| --- | --- | --- |
| MC0 | DL0 | DL1 |
| MC1 | DL1 | DL0 |
| MC2 | DL2 | DL3 |
| MC3 | DL3 | DL2 |

In the semiconductor memory of this embodiment as well, each of the sense node DL and the reference node REF of the sense amplifier 103 is loaded with a nearly equal capacitance at data read time. As with the first embodiment, therefore, the sense data SAout of the sense amplifier will never be inverted temporarily, preventing the elongation of access time.

Moreover, the common data line of a non-selected memory core is used in order to make load capacitances at the sense node DL and the reference node REF of the sense amplifier equal to each other; thus, there is no requirement of an additional circuit that provides a dummy capacitance corresponding to the load capacitance associated with each common data line. An increase in the semiconductor chip area can therefore be avoided.

Although, in this embodiment, the reference potential generating circuit RC is connected to the reference node REF of the sense amplifier 103, a modification may be made such that, as in the embodiment shown in FIG. 13, a reference potential generating circuit is connected to each of the common data lines DL0 to DL3 of the respective memory cores, or, as in the embodiment shown in FIG. 14, a reference potential generating circuit is located next to the dummy cell circuit in each memory core.

Figure 17:
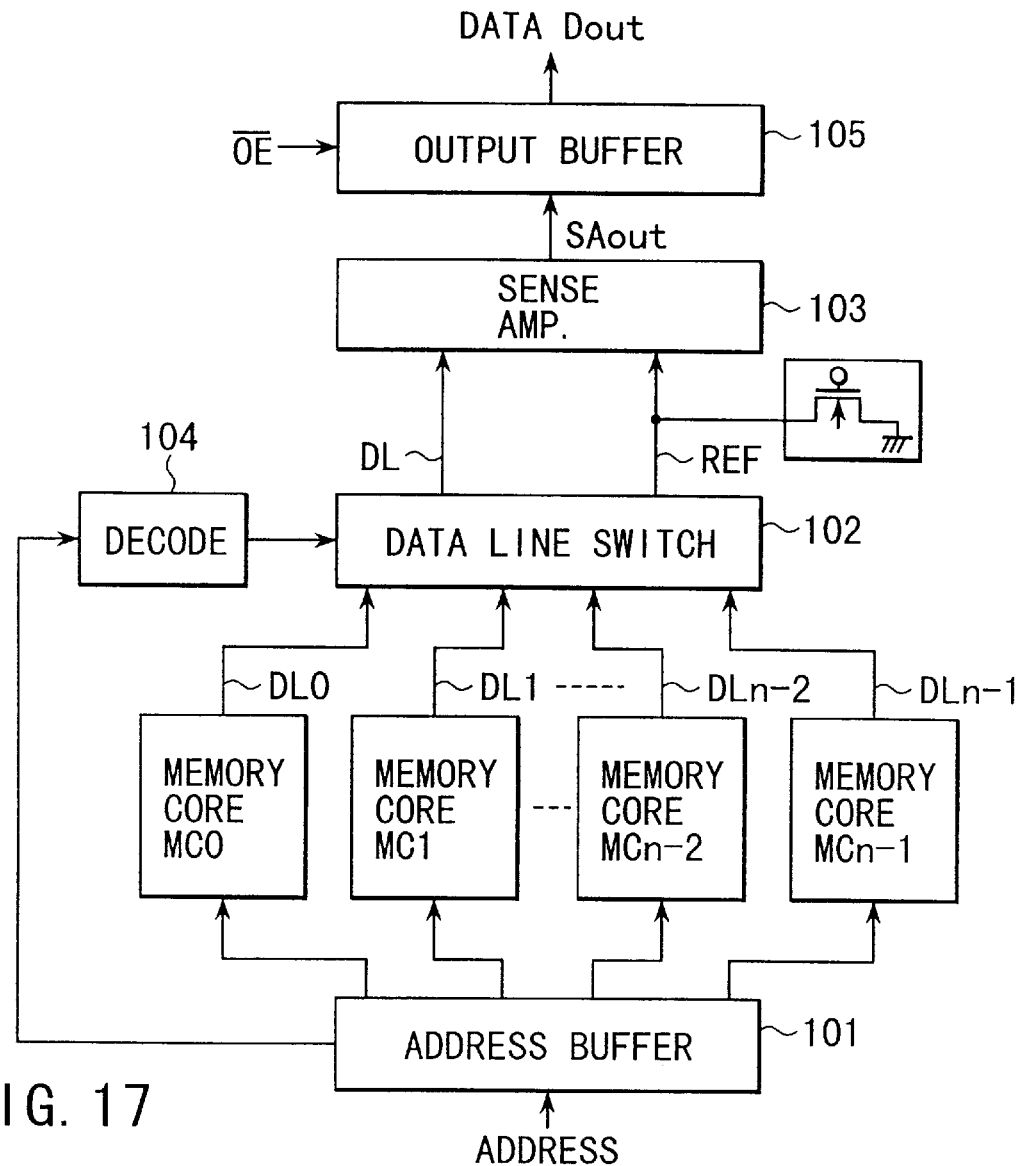
FIG. 17 shows an extension of the semiconductor memory of FIG. 6 that has n memory cores.

FIG. 17 shows an extension of the fourth-embodiment semiconductor memory shown in FIG. 16 that has more than four memory cores. These memory cores are indicated as MC0 through MCn-1. Relationships among selected memory cores, data lines connected to the sense node DL, and data lines connected to the reference node REF are shown in TABLE 2 below.

TABLE 2

| SELECTED MEMORY CORE | NODE DL | NODE REF |
| --- | --- | --- |
| MC0 | DL0 | DL1 OR DLn-1 |
| MC1 | DL1 | DL0 OR DLn-2 |
| : | : | : |
| MCn-2 | DLn-2 | DLn-1 OR DL1 |
| MCn-1 | DLn-1 | DLn-2 OR DL0 |

For example, when the memory core MC0 is read from, the common data line DL0 of the memory core MC0 is connected by the data line switch circuit 102 to the sense node DL of the sense amplifier 103. On the other hand, to the reference node REF is connected the common data line DL1 of the memory core MC1 or the common data line DLn-1 of the memory core MCn-1. At this point, in the memory cores MC1 and MCn-1, their common data lines DL1 and DLn-1 are connected to their respective dummy cell circuits.

That is, in reading from the memory core MC0, to the reference node REF is connected the common data line DL1 of the memory core MC1 located next to the memory core MC0 or the common data line DLn-1 of the memory core MCn-1 that is located symmetrical with respect to the memory core MC0 at an equal distance from the data line switch circuit 102 in the chip. Therefore, as in the semiconductor memory of the fourth embodiment shown in FIG. 16, the symmetry of common data line capacitances can be retained.

Figure 18:
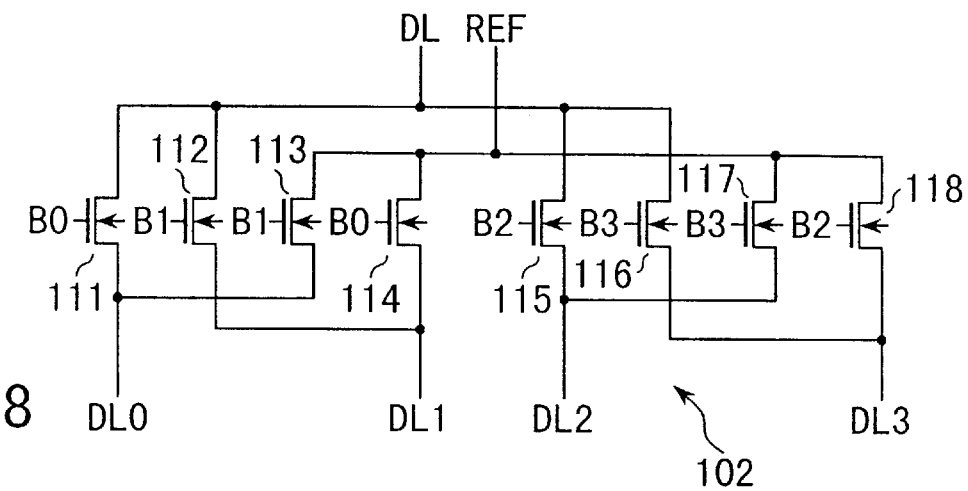
FIG. 18 shows a specific arrangement of the data line switch circuit of the semiconductor memory of FIG. 16.

FIG. 18 shows a specific arrangement of the data line switch circuit 102 in the semiconductor memory shown in FIG. 16, which is constructed from eight N-channel MOS transistors 111 to 118.

The MOS transistor 111 has its source-drain path connected between the sense node DL of the sense amplifier 103 and the common data line DL0 of the memory core MC0 and its gate connected to receive a control signal B0 from the data line decoder 104. The MOS transistor 112 has its source-drain path connected between the sense node DL of the sense amplifier 103 and the common data line DL1 of the memory core MC1 and its gate connected to receive a control signal B1 from the data line decoder 104. The MOS transistor 113 has its source-drain path connected between the reference node REF of the sense amplifier 103 and the common data line DL0 of the memory core MC0 and its gate connected to receive the control signal B1 from the data line decoder 104. The MOS transistor 114 has its source-drain path connected between the reference node REF of the sense amplifier 103 and the common data line DL1 of the memory core MC1 and its gate connected to receive the control signal B0 from the data line decoder 104.

The MOS transistor 115 has its source-drain path connected between the sense node DL of the sense amplifier 103 and the common data line DL2 of the memory core MC2 and its gate connected to receive a control signal B2 from the data line decoder 104. The MOS transistor 116 has its source-drain path connected between the sense node DL of the sense amplifier 103 and the common data line DL3 of the memory core MC3 and its gate connected to receive a control signal B3 from the data line decoder 104. The MOS transistor 117 has its source-drain path connected between the reference node REF of the sense amplifier 103 and the common data line DL2 of the memory core MC2 and its gate connected to receive the control signal B3 from the data line decoder 104. The MOS transistor 118 has its source-drain path connected between the reference node REF of the sense amplifier 103 and the common data line DL3 of the memory core MC3 and its gate connected to receive the control signal B2 from the data line decoder 104.

The output signals B0 to B3 of the data line decoder 104 are memory block address signals such that only B0 goes high when the memory core MC0 is read from, only B1 goes high when the memory core MC1 is read from, only B2 goes high when the memory core MC2 is read from, and only B3 goes high when the memory core MC3 is read from.

The memory block address signals B0 to B3 are generated by the data line decoder 104 arranged as shown in FIGS. 19A through 19D.

FIG. 19A shows an arrangement of a partial decoder which produces the control signal B0 from internal address signals /BA0 and /BA1 generated by the address buffer 101. That is, this partial decoder is composed of a two-input NAND gate 121 that receives the internal address signals /BA0 and /BA1 and an inverter 122 which produces the inverse of the output signal of the NAND gate 121.

The partial decoder that produces the control signal B1 is constructed, as shown in FIG. 19B, from a two-input NAND gate 123 that receives the internal address signals BA0 and /BA1 and an inverter 124 which produces the inverse of the output signal of the NAND gate 123.

The partial decoder that produces the control signal B2 is constructed, as shown in FIG. 19C, from a two-input NAND gate 125 that receives the internal address signals /BA0 and BA1 and an inverter 126 which produces the inverse of the output signal of the NAND gate 125.

The partial decoder that produces the control signal B3 is constructed, as shown in FIG. 19D, from a two-input NAND gate 127 that receives the internal address signals BA0 and BA1 and an inverter 128 which produces the inverse of the output signal of the NAND gate 127.

FIGS. 20A and 20B show arrangements of the dummy cell circuits of the respective memory cores MC0 and MC1 in the memory of FIG. 16.

In the dummy cell circuit of FIG. 20A, a dummy bit line DBL0 is provided which is connected to the drains of dummy cells 131 equal in number to the memory cells connected to each bit line in the memory cell in the memory core MC0. The dummy cells are of the same type as the memory cells in the memory core MC0. In this example, each dummy cell consists of an N-channel MOS transistor, which has its source and gate connected to ground.

Between the dummy bit line DBL0 and the common data line DL0 is connected the source-drain path of an N-channel MOS transistor 132 used for dummy bit line selection. The gate of the transistor 132 is supplied with the control signal B1.

FIG. 20B shows an arrangement of the dummy cell circuit in the memory core MC1 which differs from that of FIG. 20A in that the dummy bit line is DBL1, the common data line is DL1, and the control signal applied to the transistor 132 is B0. In other respects, the arrangement of FIG. 20B remains unchanged from that of FIG. 20B.

The dummy cell circuits in the other memory cores MC2 and MC3 in FIG. 16 are arranged identically to the dummy cell circuits shown in FIGS. 20A and 20B except the common data line and the memory control signal and thus description thereof is omitted.

In the fourth embodiment, the sense amplifier 103 is arranged identically to that shown in FIG. 7, the bias circuit is arranged identically to that in FIG. 9, and the output buffer 105 is arranged identically to that of FIG. 10.

FIG. 21 shows a specific arrangement of the data line switch circuit 102 used in the semiconductor memory of the fourth embodiment, which is constructed from eight N-channel MOS transistors 141 to 148, six two-input NOR gates 149 to 154, and six inverters 155 to 160.

The MOS transistor 141 has its source-drain path connected between the sense node DL of the sense amplifier 103 and an internal node DL01. The MOS transistor 142 has its source-drain path connected between the reference node REF of the sense amplifier 103 and the internal node DL01. The MOS transistor 143 has its source-drain path connected between the sense node DL of the sense amplifier 103 and an internal node DL23. The MOS transistor 144 has its source-drain path connected between the reference node REF of the sense amplifier 103 and the internal node DL23.

The MOS transistor 145 has its source-drain path connected between the internal node DL01 and the common data line DL0 of the memory core MC0. The MOS transistor 146 has its source-drain path connected between the internal node DL01 and the common data line DL1 of the memory core MC1. The MOS transistor 147 has its source-drain path connected between an internal node DL23 and the common data line DL2 of the memory core MC2. The MOS transistor 148 has its source-drain path connected between the internal node DL23 and the common data line DL3 of the memory core MC3.

The NOR gate 149 has its inputs connected to receive the decode output signals B2 and B3 of the data line decoder 104 and its output connected through the inverter 155 to the gates of the MOS transistors 142 and 143. The NOR gate 150 has its inputs connected to receive the decode output signals B0 and B1 of the data line decoder 104 and its output connected through the inverter 156 to the gates of the MOS transistors 141 and 144. The NOR gate 151 has its inputs connected to receive the decode output signals B0 and B2 of the data line decoder 104 and its output connected through the inverter 157 to the gate of the MOS transistor 145. The NOR gate 152 has its inputs connected to receive the decode output signals B1 and B3 of the data line decoder 104 and its output connected through the inverter 158 to the gate of the MOS transistor 146. The NOR gate 153 has its inputs connected to receive the decode output signals B0 and B2 of the data line decoder 104 and its output connected through the inverter 159 to the gate of the MOS transistor 147. The NOR gate 154 has its inputs connected to receive the decode output signals B1 and B3 of the data line decoder 104 and its output connected through the inverter 160 to the gate of the MOS transistor 148.

In this case as well, the output signals B0 to B3 of the data line decoder 104 are memory block address signals such that only B0 goes high when the memory core MC0 is read from, only B1 goes high when the memory core MC1 is read from, only B2 goes high when the memory core MC2 is read from, and only B3 goes high when the memory core MC3 is read from.

In the data line switch circuit 102 thus arranged, as in the data line switch circuit shown in FIG. 18, the common data lines DL0 to DL3 of the respective memory cores MC0 to MC3 can be selectively connected to the sense node DL and the reference node REF of the sense amplifier 103.

In the data line switch circuit 102 of FIG. 21, the MOS transistors are connected in a two-stage tree-structured form, which allows the length of each common data line to be reduced and the layout area to be reduced further.

Although, in the above embodiment, the detailed arrangements of the data line switch circuit 102 and the data line decoder 104 for the case where n memory cores are provided were not particularly described, these can be guessed readily by analogy with the arrangements shown in FIGS. 18, 21, and 19A to 19D. The description thereof is therefore omitted.

According to the present invention, as described above, there is provided a semiconductor memory which allows the elongation of access time resulting from sense amplifier malfunctions due to noise to be prevented with little increase in integrated-circuit chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a plurality of memory cores each having at least one memory cell array composed of a plurality of memory cells, a plurality of word lines connected to the memory cells, a plurality of bit lines connected to the memory cells, a data line, and a column gate circuit for selectively connecting the bit lines to the data line, the memory cores being selected one at a time to read data from a selected memory cell;
   a sense amplifier having first and second input nodes for amplifying a potential difference between the first and second input nodes to sense data; and
   a data line switch circuit for connecting the data line associated with a selected one of the memory cores to the first input node of the sense amplifier and connecting the data line associated with a non-selected one of the memory cores to the second input node of the sense amplifier, wherein the load capacitances on the first input node and the second input node are substantially equal to each other during a read operation.

2. The semiconductor memory according to claim 1, further comprising a reference potential generating circuit connected to the second input of the sense amplifier for generating a reference potential used in the sense amplifier.

3. The semiconductor memory according to 2, wherein the reference potential generating circuit contains a reference cell.

4. The semiconductor memory according to claim 3, wherein the reference cell is of the same type as the memory cells in the memory cell array.

5. The semiconductor memory according to claim 1, wherein each of the memory cells comprises a transistor having a source, a drain, a gate, and a channel region, the transistor having a threshold voltage dependent on an amount of impurities introduced into the channel region.

6. The semiconductor memory according to claim 1, wherein each of the memory cells comprises a non-volatile transistor having a source, a drain, a floating gate, and a control gate, the transistor having a threshold voltage dependent on an amount of charge stored on the floating gate.

7. The semiconductor memory according to claim 1, wherein each of the memory cores further comprises a dummy cell circuit having a dummy bit line, a plurality of dummy cells connected to the dummy bit line, and a switch connected between the dummy bit line and the data line, the first switch in the dummy cell circuit of the non-selected memory core being rendered conductive by a control signal to thereby make a connection between the dummy bit line and the data line of the non-selected memory core.

8. The semiconductor memory according to according to claim 1, wherein each of the memory cores further includes a row decoder for selectively driving the word lines.

9. The semiconductor memory according to claim 1, further comprising a short-circuiting control circuit for short-circuiting the first and second inputs of the sense amplifier at a predetermined time.

10. The semiconductor memory according to claim 1, wherein the sense amplifier comprises a first current mirror circuit having a first current input terminal and a first current output terminal, a second current mirror circuit having a second current input terminal and a second current output terminal, a first MOS transistor having a gate connected to receive a predetermined bias voltage and a current path connected between the first current input terminal of the first current mirror circuit and the first input node of the sense amplifier, a second MOS transistor having a gate connected to receive the predetermined bias voltage and a current path connected between the second current input terminal of the second current mirror circuit and the second input node of the sense amplifier, and a third current mirror circuit having a current input terminal connected to the second current output terminal of the second current mirror circuit and a current output terminal connected to the first current output terminal of the first current mirror circuit, sense data being taken at a connection node of the first current output terminal of the first current mirror circuit and the third current output terminal of the third current mirror circuit.

11. The semiconductor memory according to claim 10, wherein the predetermined bias voltage is set lower than a supply voltage applied to the sense amplifier.

12. The semiconductor memory according to claim 1, wherein the data line switch circuit has a first MOS transistor having a current path connected between the data line of a first one of the memory cores and the first input node of the sense amplifier and a gate connected to a first control signal and a second MOS transistor having a current path connected between the data line of a second one of the memory cores and the second input of the sense amplifier and a gate connected to a second control signal.

13. The semiconductor memory according to claim 1, further comprising a first reference potential generating circuit for generating a reference potential, a first switch connected between an output of the first reference potential generating circuit and the data line of a first one of the memory cores, a second reference potential generating circuit for generating a reference potential, and a second switch connected between an output of the second reference potential generating circuit and the data line of a second one of the memory cores, the first and second switches being controlled by control signals such that one switch is on when the other is off, and vice versa.

14. The semiconductor memory according to claim 13, wherein each of the first and second reference potential generating circuits contains a reference cell.

15. The semiconductor memory according to claim 14, wherein the reference cell is of the same type as the memory cells in the memory cell array.

16. The semiconductor memory according to claim 14, wherein each of the memory cells comprises a transistor having a source, a drain, a gate, and a channel region, the transistor having a threshold voltage dependent on an amount of impurities introduced into the channel region.

17. The semiconductor memory according to claim 14, wherein each of the memory cells comprises a non-volatile transistor having a source, a drain, a floating gate, and a control gate, the transistor having a threshold voltage dependent on an amount of charge stored on the floating gate.

18. The semiconductor memory according to claim 7, wherein the dummy cell circuit includes a reference cell connected to the dummy bit line.

19. The semiconductor memory according to claim 18, wherein the reference cell is of the same type as the memory cells in the memory cell array.

20. The semiconductor memory according to claim 18, wherein each of the memory cells comprises a transistor having a source, a drain, a gate, and a channel region, the transistor having a threshold voltage dependent on an amount of impurities introduced into the channel region.

21. The semiconductor memory according to claim 18, wherein each of the memory cells comprises a non-volatile transistor having a source, a drain, a floating gate, and a control gate, the transistor having a threshold voltage dependent on an amount of charge stored on the floating gate.

22. A semiconductor memory comprising:

first and second memory cores each having at least one memory cell array composed of a plurality of memory cells, a plurality of word lines connected to the memory cells, a plurality of bit lines connected to the memory cells, a data line, and a column gate circuit for selectively connecting the bit lines to the data line, the memory cores being selected one at a time to read data from a selected memory cell;

a sense amplifier having first and second input nodes for amplifying a potential difference between the first and second input nodes to sense data;

a data line switch circuit for connecting the data line associated with a selected one of the memory cores to the first input node of the sense amplifier and connecting the data line associated with the other of the memory cores to the second input nodes of the sense amplifier, wherein the load capacitances on the first input node and the second input node are substantially equal during a read operation.

23. The semiconductor memory according to claim 22, wherein the first reference potential generating circuit contains a reference cell.

24. The semiconductor memory according to claim 23, wherein the reference cell is of the same type as the memory cells in the memory cell array.

25. The semiconductor memory according to claim 24, wherein each of the memory cells comprises a transistor having a source, a drain, a gate, and a channel region, the transistor having a threshold voltage dependent on an amount of impurities introduced into the channel region.

26. The semiconductor memory according to claim 24, wherein each of the memory cells comprises a non-volatile transistor having a source, a drain, a floating gate, and a control gate, the transistor having a threshold voltage dependent on an amount of charge stored on the floating gate.

27. The semiconductor memory according to claim 22, wherein each of the first and second memory cores further comprises a dummy cell circuit having a dummy bit line, a plurality of dummy cells connected to the dummy bit line, and a switch connected between the dummy bit line and the data line, the switch in the dummy cell circuit of the non-selected memory core being rendered conductive by a control signal to thereby make a connection between the dummy bit line and the data line of the other memory core.

28. The semiconductor memory according to claim 22, wherein each of the first and second memory cores further includes a row decoder for selectively driving the word lines.

29. The semiconductor memory according to claim 22, further comprising a short-circuiting control circuit for short-circuiting the first and second inputs of the sense amplifier at a predetermined time.

* * * * *

UNITED STATES PATENT AND TRADEMARK OFFICE
CERTIFICATE OF CORRECTION

PATENT NO.: 6,141,277
DATED: October 31, 2000
INVENTOR: Toru TANZAWA

It is certified that an error appears in the above-identified patent and that said Letters Patent is hereby corrected as shown below:

In Claim 8, column 18, line 51:

delete the second occurrence of "according to"

Signed and Sealed this

Eighth Day of May, 2001

Attest:

NICHOLAS P. GODICI

Attesting Officer          Acting Director of the United States Patent and Trademark Office